US006921670B2

(12) United States Patent
Carpenter

(10) Patent No.: US 6,921,670 B2
(45) Date of Patent: Jul. 26, 2005

(54) NANOSTRUCTURE FABRICATION USING MICROBIAL MANDREL

(75) Inventor: Steven E Carpenter, Philmath, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 108 days.

(21) Appl. No.: 10/603,434

(22) Filed: Jun. 24, 2003

(65) Prior Publication Data

US 2005/0009208 A1 Jan. 13, 2005

(51) Int. Cl.[7] .............................................. H01L 21/00
(52) U.S. Cl. ........................... 438/1; 438/780; 264/219; 264/614
(58) Field of Search ......................... 438/1, 710, 745, 438/780; 264/219, 614, 632

(56) References Cited

U.S. PATENT DOCUMENTS

| | | |
|---|---|---|
| 6,303,388 B1 | 10/2001 | Fahey |
| 6,325,909 B1 | 12/2001 | Li et al. |
| 6,515,339 B2 | 2/2003 | Shin et al. |
| 6,841,255 B2 * | 1/2005 | Deppisch et al. ........ 428/425.5 |
| 2001/0019238 A1 | 9/2001 | Dai et al. |
| 2002/0133129 A1 | 9/2002 | Arias et al. |
| 2002/0138049 A1 | 9/2002 | Allen et al. |
| 2002/0158342 A1 | 10/2002 | Tuominen et al. |
| 2002/0167375 A1 | 11/2002 | Hoppe et al. |
| 2003/0012723 A1 | 1/2003 | Clarke |
| 2003/0021141 A1 | 1/2003 | Segal et al. |
| 2003/0026985 A1 | 2/2003 | Greiner et al. |
| 2003/0087022 A1 * | 5/2003 | Borazjani et al. ............ 427/2.1 |
| 2003/0153001 A1 * | 8/2003 | Soane et al. ................. 435/7.1 |
| 2004/0013819 A1 * | 1/2004 | Hou et al. ................... 427/580 |
| 2004/0043527 A1 * | 3/2004 | Bradley et al. ............... 438/48 |
| 2004/0058457 A1 * | 3/2004 | Huang et al. ............... 436/524 |
| 2004/0071949 A1 * | 4/2004 | Glatkowski et al. ...... 428/313.3 |
| 2004/0202723 A1 * | 10/2004 | Yu et al. ..................... 424/617 |
| 2005/0052646 A1 * | 3/2005 | Wohlstadter et al. ....... 356/311 |

FOREIGN PATENT DOCUMENTS

| | | | |
|---|---|---|---|
| EP | 1491493 | * | 12/2003 |
| JP | 2001181842 A | | 7/2001 |

OTHER PUBLICATIONS

Anon. BBC News "'Nanowire' breakthrough hailed," Apr. 1, 2003 http://news.bbc.co.uk/go/pr/fr/—/1/hi/sci/tech/2906621.stm.

R. Colin Johnson "DNA molecules form nanodevice scaffolding," EE Times, Mar. 10, 2003.

S. Stupp et al. "Supramolecular organic structures as templates for inorganic nano–objects," Institute of Nanotechnology News (Jun. 2002).

M. D. Lynch et al. "Organizing Carbon Nanotubes with Liquid Crystals," Nano Letters v. 2, No. 11 (2002) pp. 1197–1201.

R. Colin Johnson "Nanotubes self–assemble into circuit elements," EE Times Mar. 10, 2003.

M. Ahlskog et al. "A microdeposition technique for carbon nanotubes based on electron beam lithography," J. Appl. Phys. v. 85 (1999) pp. 8432–8435.

J. D. Hartgerink, "Organic Nanotubes from Cyclic Peptide Architecture," (date unknown) http://www.scripps.edu/chem/ghadiri/html/research.html.

* cited by examiner

*Primary Examiner*—Alexander Ghyka

(57) ABSTRACT

An array of nanostructures has a multiplicity of nanostructures disposed in a predetermined pattern on a substrate, the nanostructures being oriented in a predetermined orientation, and the nanostructures being characterized by interior dimensions commensurate with the dimensions of predetermined microbes. Methods of fabricating the array are disclosed.

20 Claims, 2 Drawing Sheets

US 6,921,670 B2

NANOSTRUCTURE FABRICATION USING MICROBIAL MANDREL

TECHNICAL FIELD

This invention relates generally to fabrication processes for nanostructures and more particularly to use of microbial mandrels in fabrication of nano-tube structures.

BACKGROUND

Many applications have been identified for nanostructures. In many of these applications, such as polymer reinforcements, electrodes for batteries and fuel cells, electron-emitters, gas filters, etc., the arrangement of the nanostructures can be a random or nearly random collection of hundreds, thousands, or millions of nanostructures. Some of the fabrication methods for nanostructures are well suited for fabricating the structures in such random positions and orientations. Some applications can use individual nanostructures that can be manipulated into particular configurations by using microscopic manipulation tools such as MEMS tweezers, laser light tweezers, etc. However, many other applications require orderly arrangements of nanostructures in arrays, which is not always easy to achieve.

BRIEF DESCRIPTION OF THE DRAWINGS

The features and advantages of the disclosure will readily be appreciated by persons skilled in the art from the following detailed description when read in conjunction with the drawings, wherein.

DETAILED DESCRIPTION OF EMBODIMENTS

Throughout this specification and the appended claims, the prefix "nano-" and the terms "nano-scale," "nanostructure," "nano-tube," etc. denote structures having minimum dimensions of the order of about a micrometer or less. Maximum dimensions, such as the length of a rod or tube, may of course be larger. The term "propagule," in addition to its ordinary reproductive meaning synonymous with "disseminule," denotes any precursor form of a nano-scale biological structure. For simplicity and clarity of the exposition, all the embodiments described below refer to nano-scale biological structures as "microbes" and use the adjective form "microbial."

In accordance with one aspect of the present invention, a method is provided for fabricating nano-scale structures by using microbes as mandrels for forming nanostructures. One embodiment of such a method includes providing a substrate, depositing a nutrient medium on the surface of the substrate, introducing microbes or propagules thereof onto the nutrient medium, growing the microbes to form elongated oriented sacrificial mandrels, coating each oriented sacrificial mandrel with an outer layer of a desired nano-tube material, and removing the sacrificial mandrels, while leaving oriented nano-tubes.

Figure 4A:
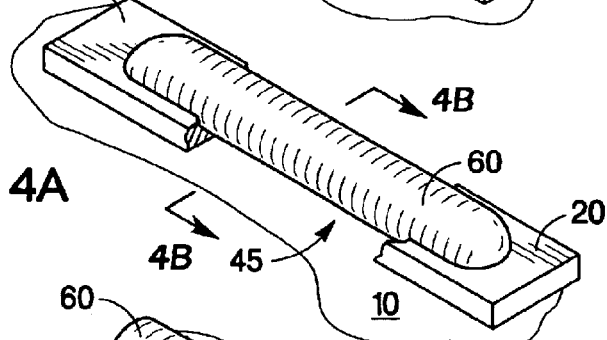
Figure 5A:
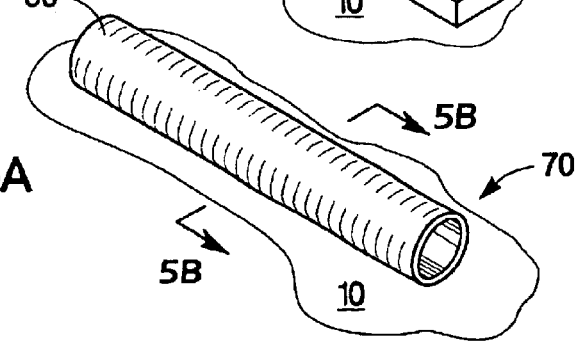
Figure 6:
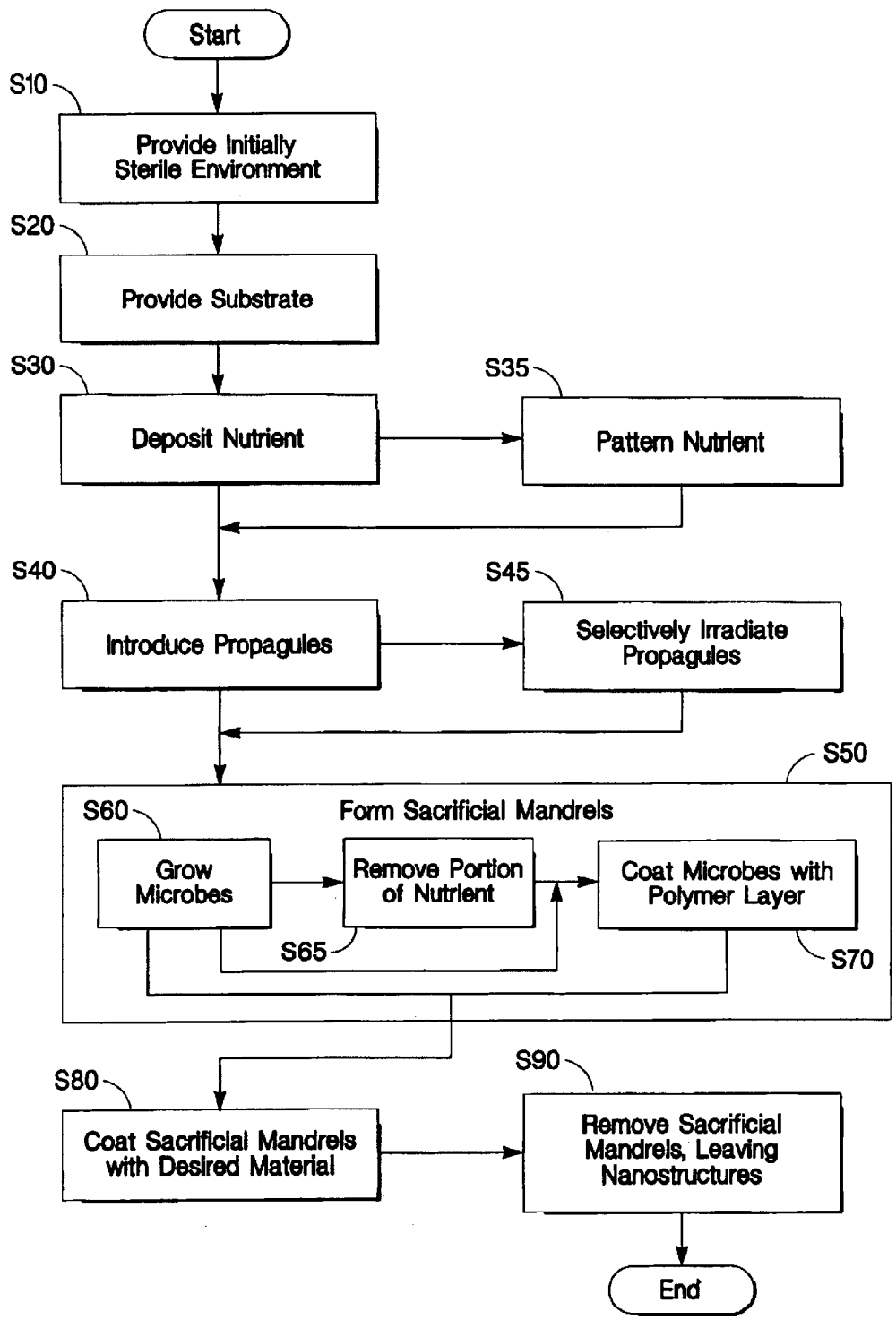
FIG. 6 is a flow chart illustrating an embodiment of a fabrication method performed in accordance with the invention.

FIGS. 1, 2, 3A, 4A, and 5A are perspective views of various stages in such an embodiment of a fabrication method performed in accordance with the invention, and FIG. 6 is a flow chart illustrating the method embodiment. In FIG. 6, various steps of the method are denoted by reference numerals S10, S20, . . . , S90.

Figure 1:
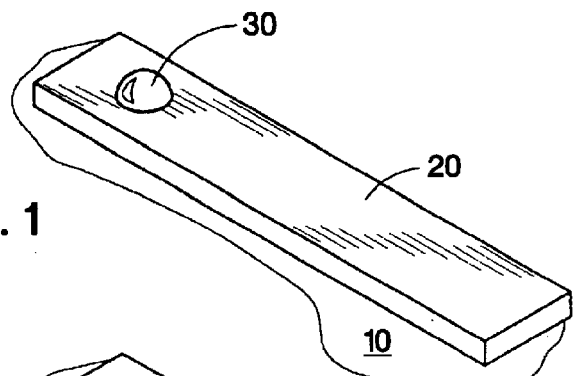
FIGS. 1, 2, 3A, 4A, and 5A are perspective views of various stages in an embodiment of a fabrication method performed in accordance with the invention.

For high yield and quality, the method is performed in an environment that is substantially free of undesired organisms. This can be achieved by providing an environment that is initially sterile (step S10). The fabrication uses a substrate 10 on which microbes will not grow (step S20). Substrate 10 can be a clean, bare, planar surface of metal, semiconductor, or insulator, for example. A silicon wafer, similar to those used in semiconductor integrated circuit fabrication processes, is a convenient kind of substrate. Glass and quartz substrates are also convenient alternatives. As shown in FIG. 1, a quantity of nutrient material 20 is deposited (step S30) on substrate 10 and optionally patterned (step S35), and a suitable microbe propagule 30 is introduced on the patterned nutrient (step S40). Any propagules introduced onto parts of the substrate that are free of nutrient will not grow.

Optionally, in applying the method to make a number of nanostructures simultaneously, selected propagules 30 may be irradiated (step S45) with actinic radiation such as ultraviolet light or X-rays to prevent their growth. Irradiating step S45 may be used as an alternative to, or in addition to, patterning step S35 in some applications of the method. The pattern formed by the patterned nutrient has dimensions commensurate with the desired size and orientation of the microbe to be grown.

Figure 2:
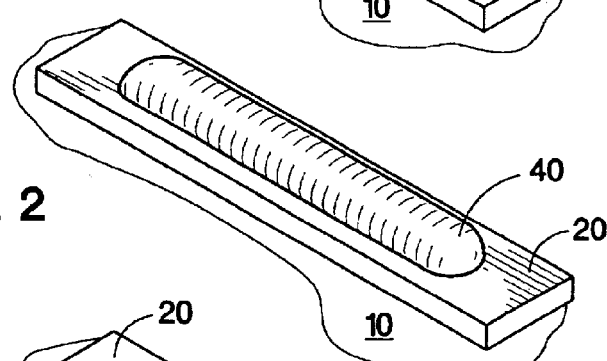
Figure 3A:
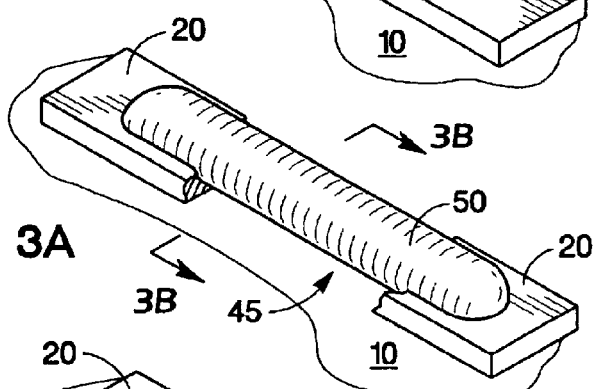
Figure 3B:
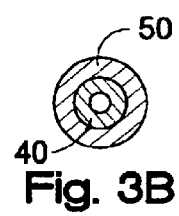
FIGS. 3B, 4B, and 5B are side elevation cross-section views of structures corresponding to FIGS. 3A, 4A, and 5A respectively.

In the next part of this method embodiment, a sacrificial mandrel is formed (step S50). On the nutrient, a microbe 40 grows from the propagule (step S60), generally following the pattern of the nutrient, as shown in FIG. 2. Optionally, a portion of the nutrient may be removed (step S65) by conventional masking and non-directional etching techniques if needed to provide an opening 45 under microbe 40 (FIG. 3A). Microbe 40 is optionally conformally coated with a polymer layer 50, as shown in FIGS. 3A and 3B (step S70). This forms a sacrificial mandrel for the succeeding steps.

Figure 4B:
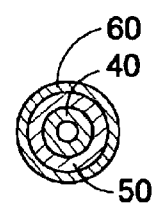
Figure 5B:
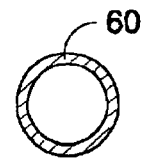

FIGS. 3B, 4B, and 5B are side elevation cross-section views of structures corresponding to FIGS. 3A, 4A, and 5A respectively. In FIG. 3B, the core of the sacrificial mandrel is the microbe 40, and the outer layer consists of conformal polymer coating 50. Polymer layer 50 may be polymethylmethacrylate (PMMA), a polyimide, or a photoresist, for example, though generally photosensitivity is not required. Polymer layer 50 may conveniently be polymerized in situ on the microbe surface, for example with parylene, which readily forms a conformal coating when polymerized in situ. Another useful alternative polymer for polymer layer 50 is a polynorbornene, such as Unity™ Sacrificial Polymer, which may be cleanly removed by pyrolysis at 350–425 C. This material is commercially available from Promerus Electronic Materials of Brecksville, Ohio. Polymer layer 50, if used, serves to stiffen the sacrificial mandrel and to prevent collapse. The sacrificial mandrel is coated with a layer of material 60 chosen to form the desired nanostructure (step S80).

Outer layer material 60 may be an inorganic substance, a conductive material such as a metal, a semiconductor, or an insulator as appropriate to the application. Gold is a suitable metal for many applications. Many suitable materials are known to those skilled in the art, including the conventional materials used in semiconductor integrated circuit fabrication.

While FIGS. 3A, 3B, 4A, and 4B show intermediate polymer layer 50, the microbe itself may be used as the sacrificial mandrel, without intermediate layer of polymer 50. That is, the nanostructure material 60 may be conformally coated directly onto microbe 40.

In step S90, the sacrificial mandrel is removed, leaving nanostructure 70. FIG. 5B illustrates the cross-section of the hollow nanotube formed in this example. Any remaining nutrient material 20 can be removed from the substrate at the same time, e.g., by the same process by which the sacrificial mandrel is removed. Step S90 of removing the sacrificial mandrels may be performed in vacuum or partial vacuum, e.g. by plasma etching with oxygen plasma. Alternatively, step S90 of removing the sacrificial mandrels may be performed by wet etching, e.g., with nitric acid.

It will be understood that non-pathogenic microbes should be used. While the elongated microbes 40 shown in the drawings have a generally cylindrical rod shape, those skilled in the art will recognize that other forms of microbes exist that can be used in the methods of the present invention. Various shapes, such as coccus, rod, spiral, and helical prokaryotes are suitable. Some eukaryotic microbes, such as animals, plants, and fungi, are also suitable, as noted hereinbelow.

Other microbial shapes of microbe 40 that may be chosen for particular applications include globose, subglobose, oblate spheroidal, suboblate spheroidal, ellipsoidal, oval, fusiform, filiform, acerose, discoidal, lenticular, bacilliform, sigmoid, reniform, allantoid, lunate or crescentic, falcate, ovoid, obovoid, lecythiform, pyriform, obpyriform, clavate, obclavate, capitate, spathulate, bicampanulate, turbinate, rhomboidal, cuneiform, dolabriform, campanulate, napiform, biconic, lageniform, peltate, ampulliform, doliiform, cymbiform or navicular, acicular, subulate, hamate or uncinate, corniform, circinate, and ventricose shapes, and shapes with papillate, mucronate, or acute apices.

Some specific suitable microbes are filamentous fungi, exemplified by the genera *Acremonium, Fusarium,* and *Penicillium*; filamentous bacteria, including *Cyanobacteria* and *Actinomycetes*; filamentous animals, including, for example, filamentous Chromista, such as the genus *Saprolegnia* and allies; filamentous plants, such as the algae genera *Spirogyra, Tribonema, Oedogonium*; and the filamentous, siliceous diatoms, such as the genus *Melosira*.

As a particular example of a useful choice for the microbe shape, helical microbes may be used as the cores of the sacrificial mandrels to make nano-springs by methods performed in accordance with the present invention.

A suitable nutrient 20 is conventional agar-agar culture medium, which may be deposited as a thin film on substrate 10 and patterned by conventional lithographic methods, including ink-jet-printing methods or embossing (imprint) lithography. Additional conventional nutrients such as malt may be mixed with the agar-agar for particular microbes if desired. Alternatively, other conventional microbe nutrients may be used.

In employing the methods of the present invention to fabricate a nanostructure array consisting of many nanostructures, the nanostructures are made simultaneously on the same substrate 10. At least propagule-introducing step S40 and microbe-growing step S60 of FIG. 6 are performed in an environment substantially free of undesired organisms and having illumination and temperature range controlled to be suitable for microbial growth. In nutrient-medium-patterning step S35, the nutrient is patterned to form a multiplicity of nutrient islands spaced apart from each other. This patterning may be done before step S40 of introducing propagules 30. If the microbes introduced onto the nutrient medium are elongated (e.g., generally cylindrical) and have a characteristic diameter, patterning of the nutrient medium in step 35 may include forming islands having at least one lateral dimension greater than or equal to the characteristic diameter of the microbes. The microbes tend to grow parallel to the direction of the longer dimension of the islands.

Thus, another aspect of the invention is an array of nano-tubes, fabricated by the methods described hereinabove. The spacing and orientations of the nanotubes of the array are determined by the spacing and orientations of the islands of nutrient previously patterned.

A specific embodiment of a method for fabricating nanoscale structures performed according to the invention includes the steps of providing a substrate 10 having a surface on which microbes cannot grow, providing an environment substantially free of undesired organisms, depositing and patterning a nutrient medium 20 on the surface of the substrate to form a multiplicity of nutrient islands spaced apart from each other, introducing elongated, generally cylindrical microbes 40 or their precursors 30 onto the nutrient medium, growing the microbes 40 to form oriented sacrificial mandrels, optionally removing a portion of the nutrient medium 20, coating each oriented sacrificial mandrel with an intermediate layer of polymer 50 and an outer layer 60 of a desired nano-tube material, and removing the sacrificial mandrels and the intermediate layer of polymer, while leaving oriented nano-tubes 70. If the intermediate polymer layer 50 is not needed, it may be omitted. These embodiments of the method may also be practiced by performing the steps in the order recited above, or the order may be varied for particular applications. For example, in some instances, the nutrient medium 20 may be patterned after introducing microbes 40 or their precursors 30.

In accordance with another aspect of the invention, an array of nanostructures is provided, comprising a multiplicity of nanostructures disposed in a predetermined pattern on a substrate, the nanostructures being oriented in a predetermined orientation, and the nanostructures being characterized by interior dimensions commensurate with the dimensions of predetermined microbes. A simple example of each nanostructure of such an array is a nano-tube.

In accordance with yet another aspect of the invention, a method is provided for using microbes 40 to form nanotubes, the method comprising the steps of providing a substrate 10, depositing a nutrient medium 20 on the surface of the substrate, introducing elongated microbes 40 or their precursors 30 onto the nutrient medium, growing the microbes 40 to form oriented sacrificial mandrels, optionally removing a portion of the nutrient medium 20, coating each oriented sacrificial mandrel with an outer layer of a desired nano-tube material 60, and removing the sacrificial mandrels, while leaving oriented nano-tubes. As described above, an intermediate polymer layer 50 may be used between microbes 40 and outer layer 60 if desired.

In accordance with another aspect of the invention, a nano-scale structure carried by a substrate may be made. Such a nano-scale structure comprises an elongated microbe, the microbe being affixed to the substrate at one of its ends; a polymer coating covering the elongated microbe; and an inorganic coating covering the polymer coating. The inorganic coating may comprise a conductor, a semiconductor, or an insulator. As described hereinabove, another nano-scale structure may be formed by removing the microbe and/or by removing both the microbe and the polymer coating.

INDUSTRIAL APPLICABILITY

Methods of the present invention may be used to make an individual nanostructure, a few isolated nanostructures, or a regular array consisting of a number of nano-scale structures. Nanostructures made in accordance with the present invention may be used in many applications similar to those of single-wall carbon fullerene nanotubes, such as electron emitters, as well as in many other industrial applications where nano-scale elements of various shapes, such as nano-tubes or nano-springs, are needed. An integrated circuit incorporating conductive nanostructures may be made by using the methods of the invention.

Although the foregoing has been a description and illustration of specific embodiments of the invention, various modifications and changes thereto can be made by persons skilled in the art without departing from the scope and spirit of the invention as defined by the following claims. For example, the order of steps in the methods may be varied, and equivalent materials may be used other than those used in the example embodiments described. Methods performed in accordance with the invention may be repeated a number of times and combined with other steps, including conventional semiconductor fabrication methods, to fabricate more complex nanostructures.

What is claimed is:

1. A method for fabricating nano-scale structures, the method comprising the steps of:
    a) providing a substrate having a surface;
    b) depositing a nutrient medium on the surface of the substrate;
    c) introducing microbes onto the nutrient medium;
    d) growing elongated microbes to form oriented sacrificial mandrels;
    e) optionally removing a portion of the nutrient medium;
    f) coating each oriented sacrificial mandrel with an outer layer of a desired nano-tube material; and
    g) removing the sacrificial mandrels, while leaving oriented nano-tubes.

2. The method of claim 1, wherein the surface of the substrate comprises a material on which the microbes cannot grow.

3. The method of claim 1, wherein at least the step c) of introducing and the step d) of growing microbes are performed in an environment substantially free of undesired organisms.

4. The method of claim 1, wherein at least the step c) of introducing and the step d) of growing microbes are performed in an environment having illumination controlled to be suitable for microbial growth.

5. The method of claim 1, wherein the step c) of introducing and the step d) of growing microbes are performed in an environment having temperature controlled within a range suitable for microbial growth.

6. The method of claim 1, wherein the elongated microbes are generally cylindrical.

7. The method of claim 1, further comprising the step of:
    h) patterning the nutrient medium to form a multiplicity of nutrient islands spaced apart from each other.

8. The method of claim 7, wherein the step h) of patterning the nutrient medium is performed before the step c) of introducing microbes onto the nutrient medium.

9. The method of claim 7, wherein the elongated microbes are generally cylindrical.

10. The method of claim 9, wherein the generally cylindrical microbes have a characteristic diameter, and wherein the step h) of patterning the nutrient medium includes forming islands having at least one lateral dimension greater than or equal to the characteristic diameter of the generally cylindrical microbes.

11. The method of claim 1, further comprising the step of:
    i) coating each sacrificial mandrel with an intermediate layer of polymer before performing the step e) of coating each oriented sacrificial mandrel with an outer layer of a desired nano-tube material.

12. The method of claim 1, wherein the step g) of removing the sacrificial mandrels is performed in vacuum.

13. The method of claim 1, wherein the step g) of removing the sacrificial mandrels is performed by wet etching.

14. The method of claim 1, wherein the step g) of removing the sacrificial mandrels is performed by plasma etching.

15. The method of claim 14, wherein the plasma etching is performed by using an oxygen plasma.

16. The method of claim 1, wherein the steps are performed in the order recited.

17. A method for fabricating nano-scale structures, the method comprising the steps of:
    a) providing a substrate having a surface on which microbes cannot grow;
    b) providing an environment substantially free of undesired organisms;
    c) depositing and patterning a nutrient medium on the surface of the substrate to form a multiplicity of nutrient islands spaced apart from each other;
    d) introducing microbes or propagules thereof onto the nutrient medium;
    e) growing elongated generally cylindrical microbes to form oriented sacrificial mandrels;
    f) optionally removing a portion of the nutrient medium;
    g) coating each oriented sacrificial mandrel with an intermediate layer of polymer and an outer layer of a desired nano-tube material; and
    h) removing the sacrificial mandrels and the intermediate layer of polymer, while leaving oriented nano-tubes.

18. The method of claim 17, wherein the steps are performed in the order recited.

19. A method of using microbes to form nano-tubes, the method comprising the steps of:
    a) providing a substrate having a surface;
    b) depositing a nutrient medium on the surface of the substrate;
    c) introducing microbes or propagules thereof onto the nutrient medium;
    d) growing elongated microbes to form oriented sacrificial mandrels;
    e) optionally removing a portion of the nutrient medium;
    f) coating each oriented sacrificial mandrel with an outer layer of a desired nano-tube material; and
    g) removing the sacrificial mandrels, while leaving oriented nano-tubes.

20. The method of claim 19, wherein the steps are performed in the order recited.

* * * * *